United States Patent
Calder et al.

(10) Patent No.: US 10,187,083 B2
(45) Date of Patent: Jan. 22, 2019

(54) FLEXIBLE ERASURE CODING WITH ENHANCED LOCAL PROTECTION GROUP STRUCTURES

(71) Applicant: MICROSOFT TECHNOLOGY LICENSING, LLC, Redmond, WA (US)

(72) Inventors: Bradley G. Calder, Bellevue, WA (US); Parikshit Santhan Gopalan, Mountain View, CA (US); Cheng Huang, Redmond, WA (US); Aaron W. Ogus, Redmond, WA (US); Huseyin Simitci, Bellevue, WA (US); Sergey M. Yekhanin, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 97 days.

(21) Appl. No.: 14/752,595

(22) Filed: Jun. 26, 2015

(65) Prior Publication Data

US 2016/0380650 A1    Dec. 29, 2016

(51) Int. Cl.
*H03M 13/15* (2006.01)
*H03M 13/35* (2006.01)
(Continued)

(52) U.S. Cl.
CPC ....... *H03M 13/154* (2013.01); *G06F 11/1076* (2013.01); *H03M 13/293* (2013.01);
(Continued)

(58) Field of Classification Search
CPC H03M 13/154; H03M 13/353; G06F 11/1076
See application file for complete search history.

(56) References Cited

U.S. PATENT DOCUMENTS 6,275,965 B1   8/2001   Cox et al.
7,734,643 B1   6/2010   Waterhouse et al.
(Continued)

FOREIGN PATENT DOCUMENTS

WO    2013191658 A1    12/2013

OTHER PUBLICATIONS

Mu, et al., "Cloud Storage over Multiple Data Centers", Retrieved on: Nov. 20, 2014 Available at: http://www.cs.newpaltz.edu/~lik/publications/Shuai-Mu-DC-2014.pdf.

(Continued)

*Primary Examiner* — Kyle Vallecillo
(74) *Attorney, Agent, or Firm* — Shook, Hardy & Bacon, L.L.P.

(57) ABSTRACT

In various embodiments, methods and systems for erasure coding with enhanced local protection groups are provided. An erasure coding scheme can be defined based on a Vertical Local Reconstruction Code (VLRC) that achieves high storage efficiency by combining the Local Reconstruction Code and conventional erasure coding, where the local reconstruction code (LRC) is carefully laid out across zones. Thus, when a zone is down, remaining fragments form an appropriate LRC. Further, an inter-zone erasure coding scheme—Zone Local Reconstruction Code (ZZG-2 code)— is provided having both local reconstruction within every zone and a-of-b recovery property across zones. An inter-zone adaptive erasure coding (uber code) scheme is provided, the uber code is configurable to produce near optimal performance in different environments characterized by intra and inter-zone bandwidth and machine failure rates. It is contemplated that embodiments described herein include functionality for recognizing correctable patterns and decoding techniques for coding schemes.

20 Claims, 13 Drawing Sheets

(51) Int. Cl.
*G06F 11/10* (2006.01)
*H03M 13/29* (2006.01)
*H03M 13/37* (2006.01)
*H03M 13/09* (2006.01)

(52) U.S. Cl.
CPC ... *H03M 13/2906* (2013.01); *H03M 13/2909* (2013.01); *H03M 13/2945* (2013.01); *H03M 13/2948* (2013.01); *H03M 13/353* (2013.01); *H03M 13/373* (2013.01); *H03M 13/3746* (2013.01); *H03M 13/3761* (2013.01); *H03M 13/098* (2013.01); *H03M 13/1515* (2013.01)

(56) References Cited

U.S. PATENT DOCUMENTS

| | | | |
|---|---|---|---|
| 7,822,856 | B2 | 10/2010 | Zuckerman et al. |
| 7,904,782 | B2 | 3/2011 | Huang et al. |
| 7,930,611 | B2 | 4/2011 | Huang et al. |
| 8,051,362 | B2 | 11/2011 | Li et al. |
| 8,458,287 | B2 | 6/2013 | Ozzie et al. |
| 8,473,778 | B2 | 6/2013 | Simitci et al. |
| 8,621,330 | B2 | 12/2013 | Yekhanin et al. |
| 9,378,088 | B1 * | 6/2016 | Piszczek ............ G06F 17/30194 |
| 2007/0208748 | A1 | 9/2007 | Li |
| 2013/0054549 | A1 | 2/2013 | Gopalan et al. |
| 2014/0064048 | A1 | 3/2014 | Cohen et al. |
| 2014/0115417 | A1 * | 4/2014 | Savin ................. H03M 13/1148 714/755 |
| 2014/0152476 | A1 | 6/2014 | Oggier et al. |
| 2014/0281692 | A1 | 9/2014 | Paleologu et al. |
| 2014/0380125 | A1 * | 12/2014 | Calder .................... G06F 11/10 714/766 |
| 2014/0380126 | A1 * | 12/2014 | Yekhanin ................ G06F 11/10 714/766 |
| 2015/0142863 | A1 * | 5/2015 | Yuen ..................... H03M 13/13 707/827 |
| 2016/0211869 | A1 * | 7/2016 | Blaum ................ H03M 13/373 |

OTHER PUBLICATIONS

Huang, et al., "Erasure Coding in Windows Azure Storage", In Proceedings of the USENIX conference on Annual Technical Conference, Jun. 13, 2012,12 pages.

Datta, et al, "An Overview of Codes Tailor-made for Better Repairability in Networked Distributed Storage Systems", In Proceedings of Computing Research Repository, Sep. 2011, 15 pages.

Datta, et al, "Storage Codes: Managing Big Data with Small Overheads", In International Symposium on Network Coding, Jun. 7, 2013, 6 pages.

Kiani, et al, "A Non-MDS Erasure Code Scheme for Storage Applications", In Proceedings of Computing Research Repository, Retrieved on: Nov. 20, 2014, 6 pages.

U.S. Appl. No. 14/223,596, Calder, et al., "Erasure Coding across Multiple Zones and Sub-Zones", filed Mar. 24, 2014.

U.S. Appl. No. 13/926,722, Yekhanin, et al., "Erasure Coding across Multiple Zones", filed Jun. 25, 2013.

Schnjakin, et al. "Applying Erasure Codes for Fault Tolerance in Cloud-RAID", In Proceedings of the IEEE 16th International Conference on Computational Science and Engineering, Dec. 2013, pp. 66-75.

"International Search Report and Written Opinion Issued in PCT Application No. PCT/US2016/039150", dated Jan. 3, 2017, 24 Pages.

Kamath, et al., "Codes With Local Regeneration and Erasure Correction", In the IEEE Transactions on Information Theory, vol. 60, Issue 8, Aug. 1, 2014, pp. 4637-4660.

* cited by examiner

|          | All zones | All − 1 zones | Redundancy | Notes |
|----------|-----------|---------------|------------|-------|
| Z        | 3         | 1             | 1.42       |       |
| G        | 5         | 3             | 1.42       |       |
| LL       | 3         | 1             | 1.52       |       |
| ZZ       | 5         | 2             | 1.52       |       |
| GG       | 9         | 6             | 1.52       | FRC   |
| ZG       | 7         | 4             | 1.52       |       |
| LLZ      | 5         | 2             | 1.61       |       |
| LLG      | 7         | 4             | 1.61       | BLRC' |
| ZGG      | 11        | 7             | 1.61       |       |
| ZZG      | 9         | 5             | 1.61       | HLRC  |
| LLGG     | 11        | 7             | 1.71       | BLRC  |
| LLZZ     | 7         | 3             | 1.71       | XLRC  |
| LLZG     | 9         | 5             | 1.71       | MLRC  |
| ZZGG     | 13        | 8             | 1.71       |       |
| LLZZG    | 11        | 6             | 1.80       |       |
| LLZGG    | 13        | 8             | 1.80       |       |
| LLZZGG   | 15        | 9             | 1.90       | UberCode |

FIG. 3B

FLEXIBLE ERASURE CODING WITH ENHANCED LOCAL PROTECTION GROUP STRUCTURES

BACKGROUND

Data centers may use fault-tolerant storage techniques for proficient and dependable storage of data. In particular, erasure coding techniques may be employed to reduce storage overhead. Erasure coding may be implemented across storage nodes (e.g., disk, servers and rack). Erasure coding can provide efficient recovery of missing data (e.g., data fragments) based on local protection groups that define local dependencies between code data fragments. Local protection groups can be implemented without much complexity but simple rigidly structured local protection groups can limit the recovery operation capabilities of erasure coded data when recovering missing data.

SUMMARY

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

By way of background, erasure coding data can be performed across multiple storage zones and subzones. This may be accomplished by dividing a data chunk into a plurality of fragments. Each of the plurality of fragments is associated with a zone. Zones comprise buildings, data centers, and geographic regions providing a storage service. A plurality of reconstruction parities is computed based at least in part on trade-offs or dimensions of each erasure coding scheme. In particular, dimensions such as cost, performance, and reliability define implementation constraints associated with the different erasure coding scheme across zones. Each erasure coding scheme specifies the placement of erasure coded data to achieve specific goals for fault-tolerance.

Further, erasure coding data can also be provided across a storage hierarchy. A storage service may include a zone, as described above, which is divided into multiple subzones. Each subzone may further include multiple fault domains. A subzone or a fault domain may refer to a storage level in a data center. However, other types of storage hierarchy implementation are contemplated with embodiments of the present invention. In this regard, an exemplary storage hierarchy may include zones, subzones, and fault domains. Zones, subzones, and fault domains may be part of a hierarchical storage service that provides fault tolerance. Other types of computing components and combinations thereof, beyond storage components, are contemplated within a fault tolerance hierarchy.

In embodiments described herein, novel features are directed to flexible erasure coding and decoding where erasure coded data include enhanced local protection group structures. An erasure coding scheme can be defined based on a Vertical Local Reconstruction Code (VLRC) that achieves high storage efficiency by combining the Local Reconstruction Code and conventional erasure coding, where the LRC is carefully laid out across zones. The erasure coding scheme includes an enhanced structure of local protection groups. In particular, when a zone is down, remaining fragments form an appropriate LRC. In many settings, the erasure coding scheme can exhibit an a-of-b recovery property (i.e., allows a recovery scheme for recovering some missing fragments from any collection of a fragments out of some (larger) collection of b fragments) for an appropriate a and b, as discussed herein in more detail.

In addition, an inter-zone erasure coding scheme—Zone Local Reconstruction Code ("ZZG-2 code")—provides both local reconstruction within every zone and a-of-b recovery property across zones. An inter-zone adaptive erasure coding ("uber code") scheme can be configured or trimmed to produce near optimal performance in different environments characterized by intra and inter-zone bandwidth and machine failure rates. It is further contemplated that embodiments described herein include methods and systems for recognizing correctable patterns and decoding techniques for coding schemes.

BRIEF DESCRIPTION OF THE DRAWINGS

The present invention is described in detail below with reference to the attached drawing figures, wherein:

FIGS. 3A-3B are schematic diagrams showing an exemplary erasure coding schemes in accordance with embodiments of the present invention;

DETAILED DESCRIPTION

Figure 1A:
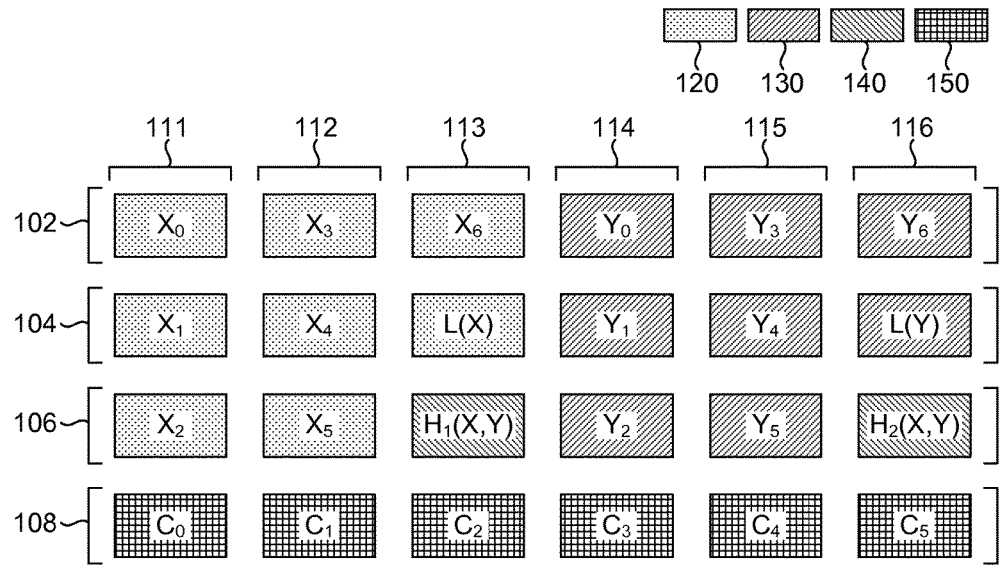
FIGS. 1A-1C are schematic diagrams showing exemplary erasure coding schemes in accordance with embodiments of the present invention.

The subject matter of embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Generally, fault-tolerance refers to the capacity for a system to continue operating in the event of the failure of (or one or more faults) some of its components. For example, fault-tolerance techniques include replication and erasure coding. Erasure coding refers to error correction algorithms that function to recover from failures of stored data. Data may be stored in different types of storage hardware with different types of storage services. Erasure coding may be implemented to provide fault-tolerance for stored data. In addition, erasure coding may also provide reduced storage overhead. For example, instead of replicating a stream of data, the data may be divided into segments and associated with one or more parities and then the segments are stored with the ability to reconstruct missing segments from remaining segments. As such, erasure coding provides cost savings in hardware, data center footprint, and power savings from not having to run the additional hardware.

Erasure coding data across zones (e.g., data centers, buildings or regions), however, comes with trade-offs or dimensions, discussed in more detail below. For example, cost, performance, and reliability having specific implementation constraints when encoding data and recovering data from failures of erasure coded data across multiple storage zones and also storage levels within a hierarchical storage. These trade-offs may be associated with different implementations of the flexible erasure coding scheme with enhanced local protection group structures. Trade-offs refer to erasure coding scheme dimensions such as cost, performance, and reliability that define implementation constraints associated with different erasure coding schemes. Each erasure coding scheme specifies the placement of erasure coded data to achieve specific goals for fault-tolerance. As such, erasure coding may be implemented with a combination of goals that include: maximizing performance under common storage node failures; minimizing storage overhead; ensuring sufficient durability and availability based on enhanced local protection group structures, where durability and availability can be specifically defined for when zones, racks, or machines fail or are taken offline for maintenance or upgrades; and exhibiting flexibility that is configurable to optimize performance in different types of environments.

Generally, erasure coding encodes data using particular types of code. For example, Reed-Solomon is a conventional approach for erasure coding data. Optimal erasure codes have the property that any k out of n coded symbols are sufficient to recover the original data. Optimal erasure codes are maximum distance separable (MDS) codes. In particular, linear block codes that achieve equality in the Singleton bound are called MDS code. Reed-Solomon codes and their extended versions are MDS codes. A Reed-Solomon implementation may include 6 data fragments and 3 code (parity) fragments for recovering the 6 data fragments. Another type of erasure coding is Local Reconstruction Codes (LRC). Compared to Reed-Solomon, LRC reduces the number of erasure coding fragments that need to be read when reconstructing data fragments that are offline, while keeping storage overhead low. For example, with 6 data fragments, LRC generates 4 parity fragments instead of 3. Two local parity fragments, each associated with different sets of 3 data fragments out of the 6 fragments and two global parity fragments for the 6 data fragments. So in contrast to Reed-Solomon that uses a parity and 5 data fragments to reconstruct a failed data fragment, LRC uses a local parity and 2 data fragments in the same set to reconstruct the failed data fragment. LRC provides more flexibility than Reed-Solomon in balancing storage overhead vs. reconstruction cost. For the above example, LRC adds one more parity than Reed-Solomon, while reducing reconstruction cost by half. Alternatively, LRC can keep the same reconstruction cost as Reed-Solomon while reducing the storage overhead significantly.

Local Reconstruction Codes may be formally defined. A (k, l, r) LRC divides k data fragments into l groups, with k/l data fragments in each group. The erasure coding scheme computes one local parity within each group. In addition, it computes r global parities from all the data fragments. Let n be the total number of fragments (data+parity). Then $n=k+l+r$. Thus, the normalized storage overhead is $n/k=1+(l+r)/k$. The LRC in this example is a (6, 2, 2) LRC with storage cost of $1+4/6=1.67x$.

Further, LRC codes may be determined based on coding equations chosen such that the LRC achieves a maximally recoverable (MR) property, which means it can decode any failure pattern which is information-theoretically decodable. For example, with reference to the example above, if all 3 data fragments in the same group and the associated local parity fail, the pattern is non-decodable because the remaining local parity associated with the other group and the two global parities cannot decode the 3 data fragments, thus are information-theoretically non-decodable. Otherwise, failure patterns that are possible to reconstruct are called information-theoretically decodable. An LRC may be associated with single set of coding equations that achieve maximally recoverable property.

A storage system (e.g., a distributed storage system running a storage service) can be governed by the following three basic considerations. Firstly, the data can be stored for reliability, (i.e., store it in a redundant encoded form) ensuring that if a bounded number of machines, racks, or datacenter zones fail no information is lost. Secondly, the data can be stored for availability, in that the data is available for the users, (i.e., no correlated failure—within bounds—should render any piece of the data unavailable). Finally, the data can be stored to limit redundancy where storing too much redundant data limits optimization of the overall storage cost.

With erasure codes, efficient recovery of missing data fragments can be achieved by having short local dependencies between coded fragments. Such dependencies can be referred to as local protection groups. Conventional erasure coding schemes for storage implement simple and rigid structures of local protection groups, e.g., in [k,n]. Reed Solomon codes there are no non-trivial local protection groups whereas in in (k, l, g) Local Reconstruction Codes (LRCs) there are k/l disjoint local groups of size l+1, in various erasure codes detailed in U.S. patent application Ser. No. 13/926,722, filed Jun. 25, 2013, entitled "ERASURE CODING ACROSS MULTIPLE ZONES", which is herein incorporated by reference in its entirety and U.S. patent application Ser. No. 14/223,596, filed Mar. 24, 2014, entitled "ERASURE CODING ACROSS MULTIPLE ZONES AND SUB-ZONES", which is herein incorporated by reference in its entirety. Local protection groups can be implemented without much complexity but simple rigidly structured local protection groups can limit the recovery operation capabilities of erasure coded data when recovering missing data.

Embodiments of the present invention provide simple and efficient methods for fault-tolerance based on enhanced local protection group structures in erasure coding schemes. Enhanced local protection groups can improve on previous conventional erasure coding schemes. In particular, enhanced local protection groups can facilitate faster recovery of missing fragments in various failure scenarios and can also provide an important a-of-b recovery property, (i.e., allows one to recover some missing fragments from any collection of a fragments out of some (larger) collection of b fragments). The latter property may significantly reduce latency as it allows a distributed storage system to weed out slow nodes (stragglers).

It is further contemplated that erasure coding schemes defined herein can provide a flexible erasure coding scheme. A flexible erasure coding scheme can refer to an erasure coding scheme that can be adapted to various environments. Advantageously, flexible erasure coding schemes have several configurations that support handling recovery operations. In many configurations of interest, a single flexible coding scheme can be adapted to various environments (characterized by intra and inter-zone bandwidth, machine failure rates, etc.), rather than a large collection of unrelated coding schemes.

As such, embodiments described herein include simple and efficient methods and systems for erasure coding that can be deployed across multiple datacenter zones and achieve the following goals: maximize performance under common storage node failures; minimize storage overhead; ensure sufficient durability and availability (even when zones, machines, racks fail or are taken offline for maintenance or upgrade) through having an enhanced structure of local protection groups; and exhibit flexibility, (i.e., can be "trimmed" to optimize performance in different environments). Accordingly, several different erasure coding schemes can be defined with enhanced local protection group structures.

A first erasure coding scheme, Vertical LRC-VLRC, can achieve high storage efficiency based on combining LRC that is defined across zones and conventional erasure coding. VLRC erasure coding scheme comprises enhanced local protection group structures that, when a zone is down, remaining fragments form an appropriate LRC. In many configurations, the VLRC erasure coding scheme also exhibits the a-of-b recovery property for an appropriate set of a and b.

Figure 1B:
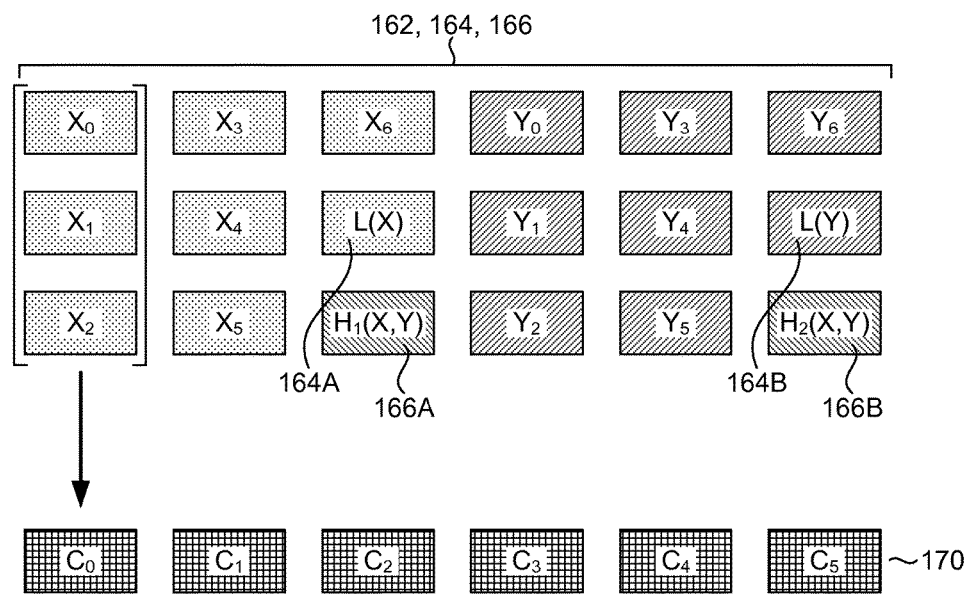
Figure 1C:
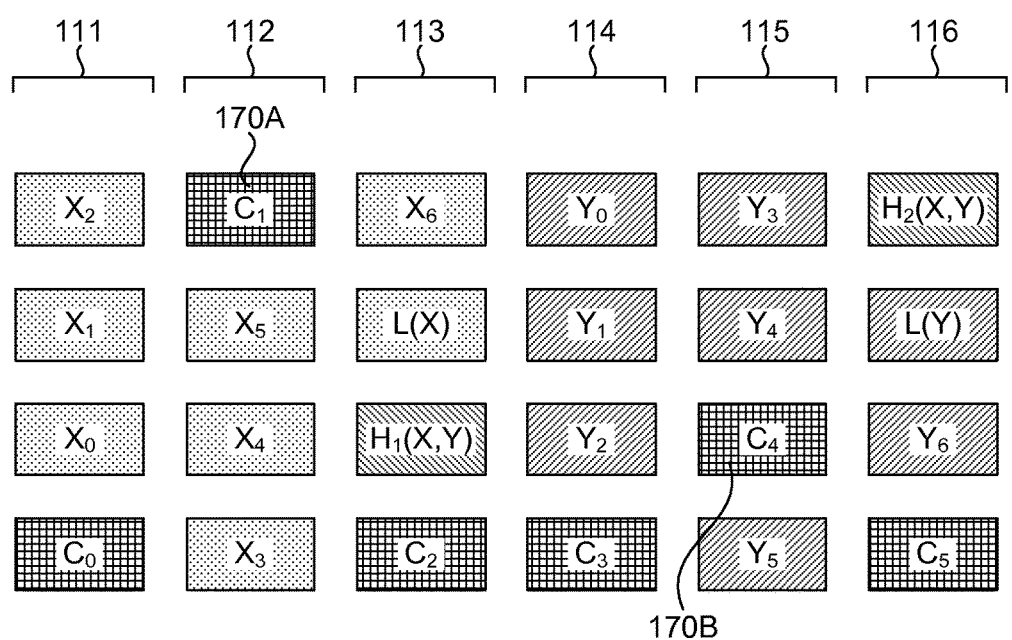

With reference to FIGS. 1A-1C, FIG. 1A illustrates an exemplary VLRC with enhanced local protection group structures. The VLRC erasure coding scheme is illustrated by way of example using a four zone case scenario, where the failure of any single zone can be recovered without data loss. The use of a four zone case scenario is not meant to be limiting, as such it is contemplated that the VLRC scheme can be readily generalized into more zones to accommodate failure beyond a single zone.

With continued reference to FIG. 1A, the VLRC erasure coding scheme encodes data for four zones—zone 102, zone 104, zone 106, and zone 108. A data chunk is divided into fragments and placed in zones (e.g. zone 102, zone 104, and zone 106) and a plurality of parity fragments can be computed for the zones and a parity zone (e.g., zone 108). For example, fragments in a zone are placed on different racks. As such, the VLRC scheme includes, by way of example, at least 6 racks per zone. Zone 102, zone 104, and zone 106 define LRC fragments 160 that form a 14+2+2 LRC. The LRC fragments include group 120, group 130, and group 140. The LRC data fragments 160 include fragments 162 (14 data fragments Xi and Yj), fragment 164 having data chunks 164A and 164B (two local parities L(X) and L(Y)) and fragment 166 having data chunks 166a and 166b (two global parities H1 and H2) that depend on all 14 data symbols.

Zone 108 includes linear combination fragments 170. Specifically, the Ci fragments in zone 108 are linear combinations generated from three other fragments in the same column. The linear combination fragments define a group 150. The linear combination of fragments in column groups (e.g., column group 111, column group 112, column group 113, column group 114, column group 115, and column group 116) in a vertical direction computes the fragments in the linear combination zone 108. It is contemplated that the zone fragments in zone 108 upon computation can be arbitrarily placed within a corresponding column group 111, column group 112, column group 113, column group 114, column group 115, and column group 116. As shown in FIG. 1C, zone 108 fragments 170A and 170B are defined in a permissible layout.

Advantageously, the configuration of the VLRC erasure coding generates enhanced local protection group structures. There exist many local protection groups beyond the two local protection groups coming from the LRC and column groups. The VLRC scheme includes several properties defined below. Properties can be specifically achieved under optimal setting of coefficients in Ci and Hj. VLRC properties include arbitrary 5 failure patterns being correctable. In addition, upon a zone coming down, arbitrary 3 failure patterns are correctable. When a zone is down, 18 fragments in 3 surviving zones can form either a 14+2+2 LRC, or a 14+2+2 code that is a variant of LRC where global parities are included in local groups; or a 14+2+2 code, where one heavy parity is included in the corresponding local group, and the other is not. In addition, when a single data fragment is unavailable a recovery operation can be performed by accessing 3-of-3 fragments in the same column, or a 7-of-8 (or 8-of-9) carefully chosen fragments. The enhanced local protection group structures allow flexibility in serving reads from a zone that is unavailable. 3-of-3 fragments in the same column, or a 7-of-8 (or 8-of-9) carefully chosen fragments are accessible. The overall stretch (space overhead) of the VLRC erasure coding scheme is about 1.71.

Figure 2:
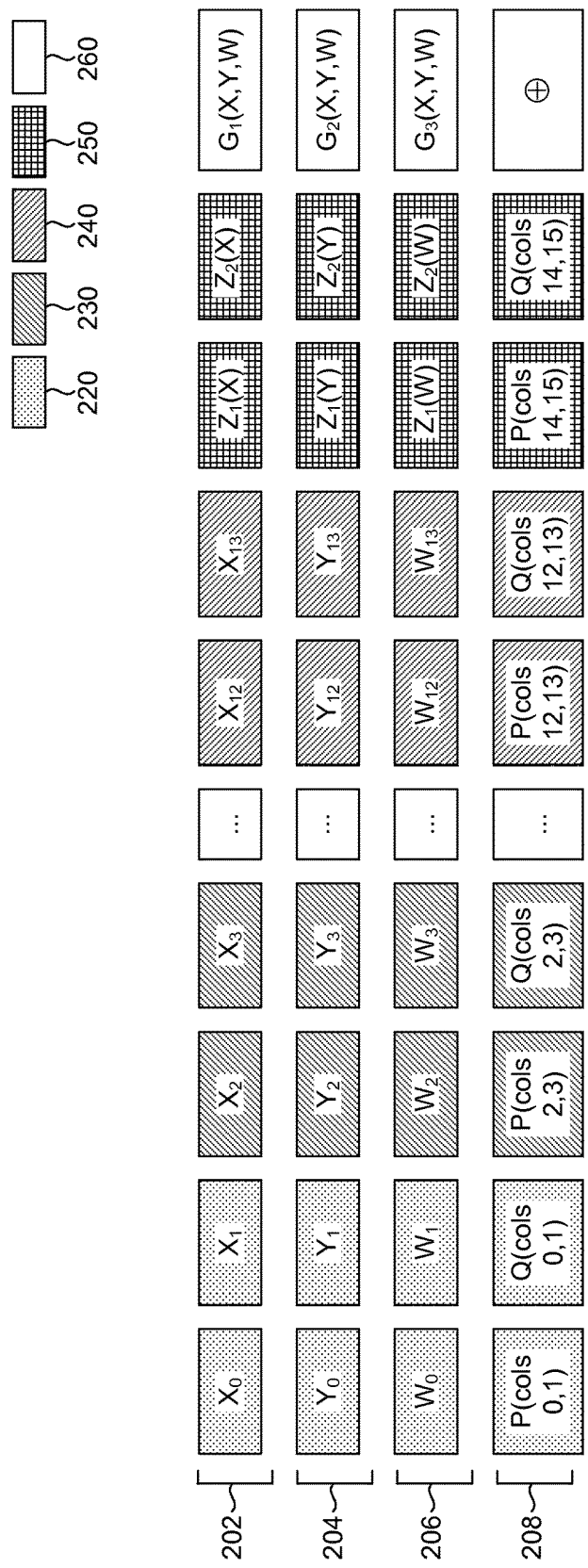
FIG. 2 is a schematic diagram showing an exemplary erasure coding scheme in accordance with embodiments of the present invention.

A second erasure coding scheme—Zone Local Reconstruction Code ("ZZG-2 code") is an inter-zone erasure coding scheme. The ZZG-2 erasure coding scheme can provide both local reconstruction within every zone and a-of-b recovery property across zones. Turning to FIG. 2, as in the VLRC erasure coding scheme, a data chunk is divided into fragments and placed in different zones—zone 202, zone 204, and zone 206. There exists 14*3=42 data fragments (Xi, Yj, and Wk), and 17*4=68 fragments total. Sets of fragments comprised of the plurality of data fragments define column groups (e.g., column group 220, column group 230, column group 240, column group 250, and column 260). A linear combination of the first 14 data fragments in each zone can define zone parity fragments (e.g., Z1(X) Z2(X), Z1(Y) Z2(Y), and Z1(W) Z2(W)). Further, the first 16 symbols in each zone form a [14, 16] MDS code including the corresponding zone data fragments (e.g., Z1 and Z2). Consecutive pairs of columns, i.e., columns 0 and 1, then 2 and 3, then 4 and 5, etc., each form a [6,8] MDS code. This can be referred to as a doubling-column technique. Linear combination of appropriate fragments in the consecutive column pairs define column parities in zone 208 (e.g., P (cols 0, 1) and Q (cols 0, 1)). The last column is not paired with any other column. It forms a simple [3,4] code. The ZZG-2 layout advantageously allows for pairing of columns together in an MDS configuration and concurrently maintaining an MDS code in each zone. Defining the ZZG-2 in this manner is inconsistent with classical coding theory wisdom and but yields the following important properties, ideally with the optimal setting of coefficients in P's, Q's, Z's, and G's).

When a single data fragment is missing, the data fragment can be recovered by accessing 7-of-8 fragments across zones or 14-of-15 fragments within a zone. When a zone is down, reads from a missing zone can be served by accessing 6-of-6 fragments across zones. When a zone is down any pattern of 5 failures is correctable. When all zones are present any pattern of 9 failures is correctable. It is contemplated that patterns of 10 failures can also be recovered when zones all zones are present. The overall stretch (space overhead) of the current scheme is about 1.62.

Figure 3A:
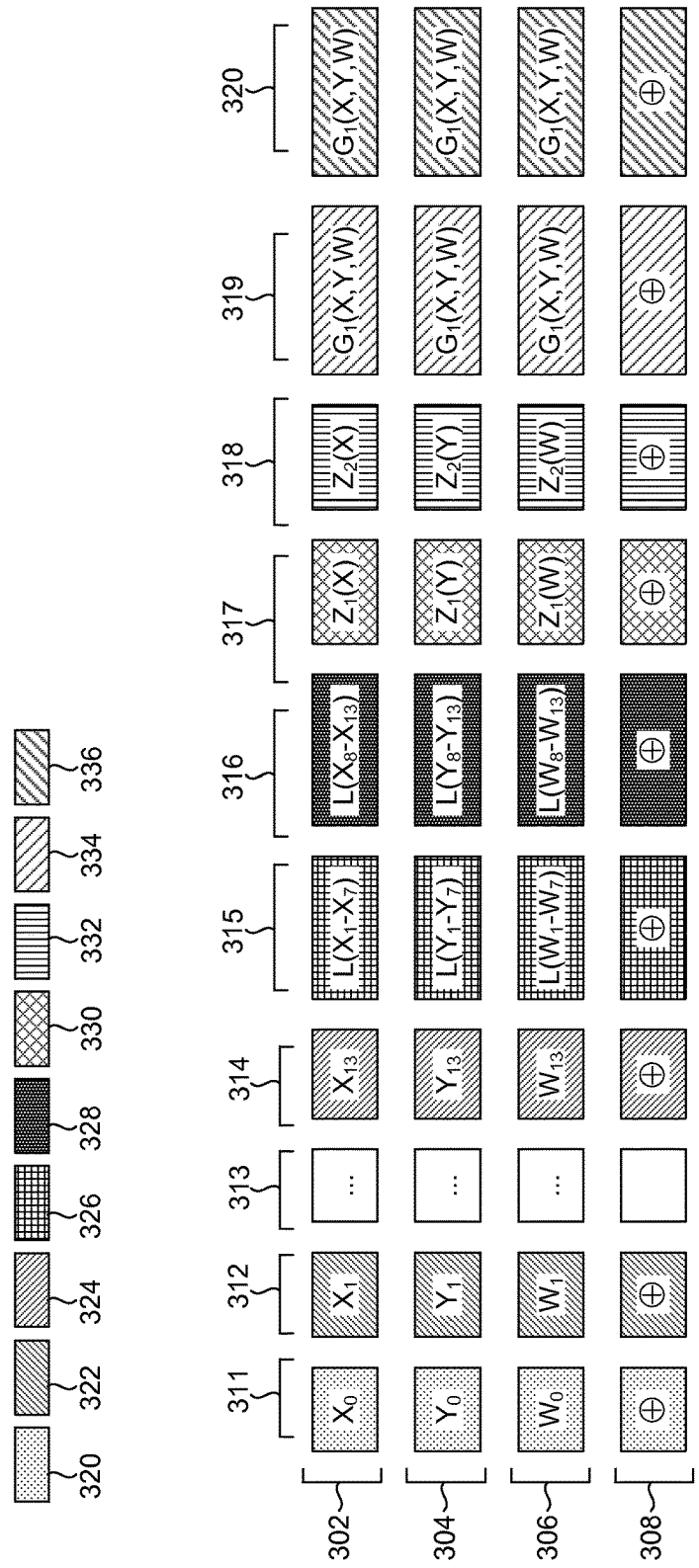

A third erasure coding scheme ("uber code") is an inter-zone adaptive erasure coding scheme. The uber code is configurable (i.e., trimmed) to produce a near optimal performance in different environments characterized by intra-zone bandwidth, inter-zone bandwidth, and machine failure rate attributes. In other words, configuring the uber code can include selective identification of fragments (for inclusion or omission) in an implementation of the uber code to support different environments. Turning to FIG. 3A, as in the VLRC erasure coding scheme, a data chunk is divided into fragments and placed in different zones—zone 302, zone 304, and zone 306. There are 14*3=42 data fragments (Xi, Yj, and Wk), and 20*4=80 fragments total. The zone 308 comprises an exclusive-or (XOR) zone having XOR fragments. The XOR fragments are defined based on XOR of fragments in a corresponding column (e.g., column groups 311 to 320). In particular, the column groups include a total of 6 parity columns (column groups 315-320), two columns of local parities (column groups 315 and 316), two columns of zone parities (column groups 317 and 318) and two columns of global parities (column groups 19 and 20). The global parities depending on the 42 data fragments.

The uber code coding scheme is an adaptive coding scheme in that a select subset of parities can be deployed in different implementations of the uber code. For example, depending on a particular datacenter environment, optimal tradeoffs for the datacenter environment can be attained using different variation of parities deployed in the uber code. Tradeoffs can be determined between space efficiency, availability, and reliability. By way of example, one can choose not to deploy all 6 parity columns, but rather deploy some subset of them. There exist 18 different useful restriction configurations (trimmings) of the uber code that can be obtained this way, as shown in FIG. 3B. Columns are labeled as D, L, Z or G depending on whether they carry data symbols, local group parities, zone parities or global parities. The different configurations can be described herein based on acronyms to refer to each configuration: for example, the LLG code is obtained by including both columns of local parities and one column of global parities. Similarly, the ZZGG is obtained by including the two columns of zone parities and the two columns of global parities.

In environments characterized by low inter-zone bandwidth a storage system can include more parity columns that allow in-zone recovery, such as L-columns and Z-columns. However, if inter-zone bandwidth is not that scarce a storage system can include less L-columns and Z-columns and more G-columns. Similarly, in the regime of higher machine/rack failure rate one needs a larger number of parity columns, while in the regime of lower failure rates a storage system can have a smaller number of parity columns. The doubling-column technique discussed above for the ZZG-2 code can also be applied to the uber code.

With reference to FIG. 3B, optimal settings of coefficients in the uber code achieve performance guarantees specified in the table in FIG. 3B. For example, when all zones are present in the LLZG restriction all 9 patterns of failure are correctable. In another example—the ZZGG restriction—in the ZZGG restriction all patterns of 13 failures are correctable. Further, when a zone is missing in the LLZZG restriction all 6-patterns of failures correctable. Other variations and combinations of optimal settings of coefficients in the uber code are contemplated with embodiments described herein.

Embodiments described herein include methods and systems for recognizing correctable patterns and decoding techniques for erasure coding schemes. In particular, correctable patterns in a VLRC code or an uber code can be recognized and decoded. It is contemplated that restrictions can be associated with the uber code for correction recognition and decoding techniques, as discussed in more detail below.

An erasure pattern E of erasure coded data consists of data symbols and parity checks that are unavailable. A storage system can recover missing data symbols such that erased parity symbols can be reconstructed. A storage system can determine whether a failure erasure pattern in a VLRC erasure code data is decodable or not. In operation, for each column group in the VLRC code a determination can be made whether a linear combination fragment (i.e., a vertical parity) is available. As previously discussed, a set of fragments in the LRC and a linear combination fragment computed based on the set of fragments in the LRC define a column group. If the vertical parity is available, the operation continues with substituting the vertical parity for a failed fragment in the column group. Swapping the vertical parity for a failed fragment in the column group is based on a defined replacement ordering preference, with preference given to the lowest ordered row (from the top) over higher ordered rows in the same column group. (e.g., following the order of row, 2, 1, 0 where the top row is 0 and the lowest row before the vertical parity is 2). After substituting the vertical parity, if applicable, for each column group (based on the replacement ordering preference), the storage system can check the LRC in the top rows (e.g., rows 0, 1, and 2). If the LRC is decodable, then the original failure pattern is correctable. However, if the LRC is not decodable, then the original failure pattern is not correctable.

With reference to uber code decoding, a storage system can implement several local reconstruction procedures ("local procedures") including local group decoding, column decoding, and zone decoding. In local group decoding, each local group of 7 data symbols and their parity forms an [8; 7] parity check code that can correct a single erasure per local group. In column decoding, each column of size 4 forms a [4; 3] parity check code that can correct a single erasure per column. In zone decoding, the two local groups and the zone parities (LLZZ) within each zone form a [18; 14] LRC. These can correct any erasure pattern of the form 1 per local group+2 more.

The descriptions above also give simple tests for when each one of these procedures will succeed, provided the error locations are known. It might be possible to correct any single erasure using more than one of these procedures, so an order in which the local procedures are executed can be defined. Advantageously, column and local group decoders can be preferred over zone decoding since the number of reads is smaller.

Figure 4:
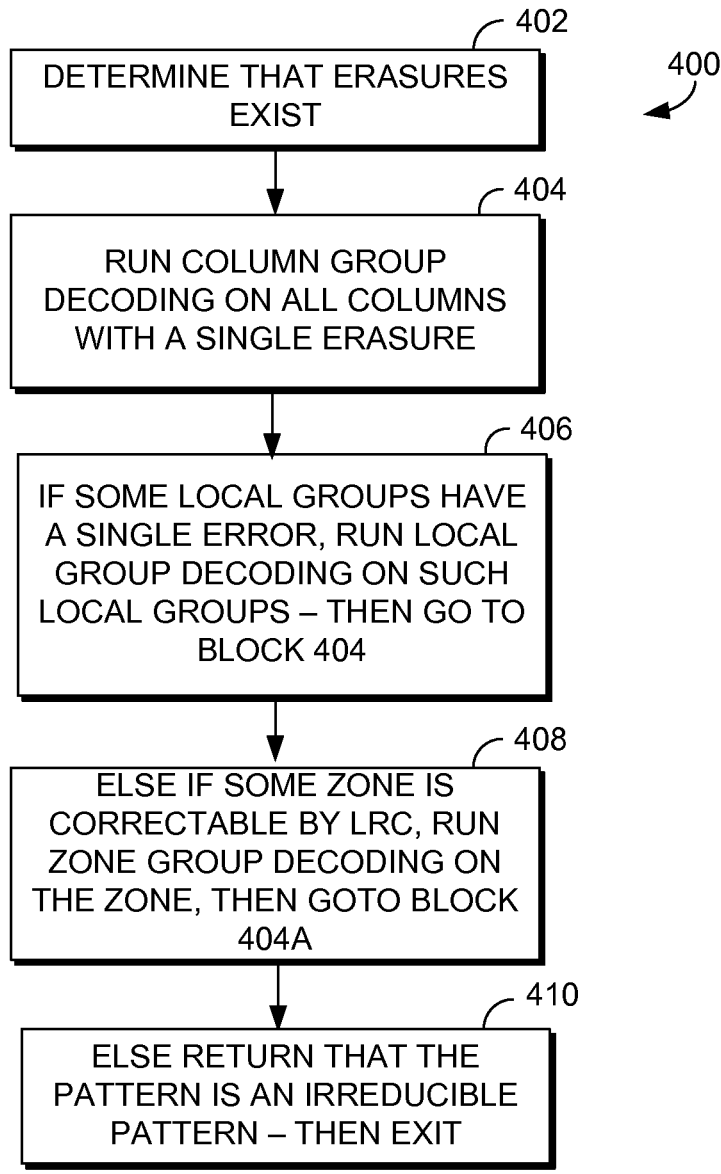
FIG. 4 is a flow diagram showing a method for local reconstruction, in accordance with embodiments of the present invention.

Accordingly, with reference to FIG. 4, a local reconstruction strategy 400 includes, first, making a determination (block 402) that erasures exist, and while erasures exist, perform the following: Step 1 (block 404)—column group decoding can be performed on all columns with a single erasure. Step 2 (block 406)—If some local groups have a single error, local group decoding is performed on all such local groups, go to Step 1. Step 3 (block 408)—Else if a zone can be corrected by LRC, run zone group decoding on the zone, go to Step 1. Step 4 (block 410)—Return "irreducible pattern" and exit. In Step 3, there might be multiple zones where LRC can make progress. The above procedure corrects one of them and then tries column/local group decoding in preference to running LRC on multiple zones, in the hope of incurring fewer reads. But a storage system could also run LRC decoding simultaneously on multiple zones. An erasure pattern is referred to as irreducible if the storage system cannot make progress on it using any local procedure.

Procedures for identifying and processing irreducible patterns are described below. An irreducible erasure pattern has at least two erasures in each local group and column where it has support, and at least 4 per zone where it has support. An irreducible erasure pattern cannot be corrected from row/column parities alone, or by decoding within a zone. The storage system needs to involve global parities or multiple zone parities (simultaneously) or both. Every column is protected by a parity check. So if the storage system knows three symbols in a column, the fourth can be reconstructed.

Figure 5A:
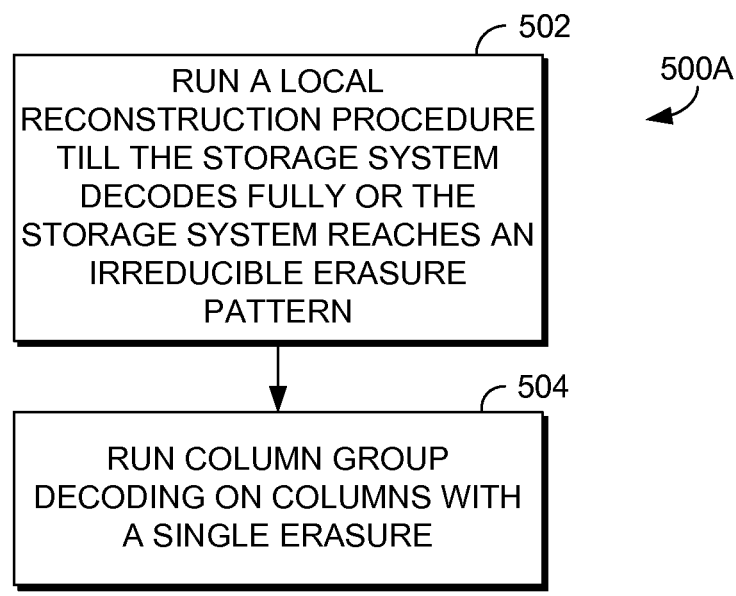
FIGS. 5A-5C are schematic diagrams showing exemplary erasure decoding schemes in accordance with embodiments of the present invention.

Accordingly, with reference to FIG. 5A, a first decoding strategy 500A includes Step 1 (block 502)—Run the local reconstruction procedure till the storage system decodes erasure codes fully or the storage system reaches an irreducible erasure pattern. Step 2 (block 504)—For every column, try to read the first three symbols. If one or more are unavailable, read the last symbol. In Step 2, the storage system only reads those symbols that have not been read already or decoded during Step 1. This convention also applies to all other strategies described herein.

In the previous decoding strategy, for every column that is error free, the storage system incurs exactly three 3 reads. Since in any irreducible pattern, a column with erasures has at least two erasures, the storage system will read two or fewer symbols from such columns. A second decoding strategy can be utilized where the storage system ensures that the parity checks that are read are indeed relevant for the erasure pattern. The relevant local group/zone parities are those local groups/zones where the (irreducible) erasure pattern has support. As indicated previously, columns are labeled as D, L, Z or G depending on whether they carry data symbols, local group parities, zone parities or global parities.

Figure 5B:
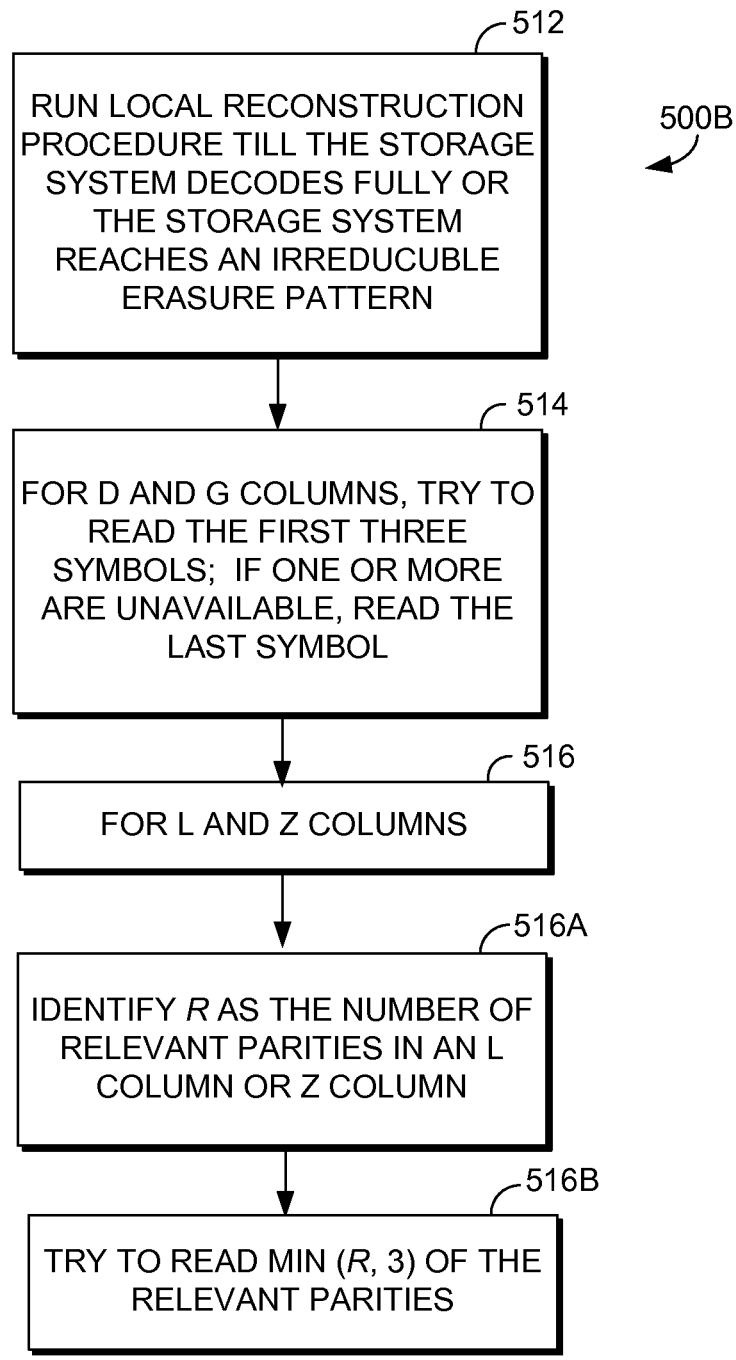
Figure 5C:
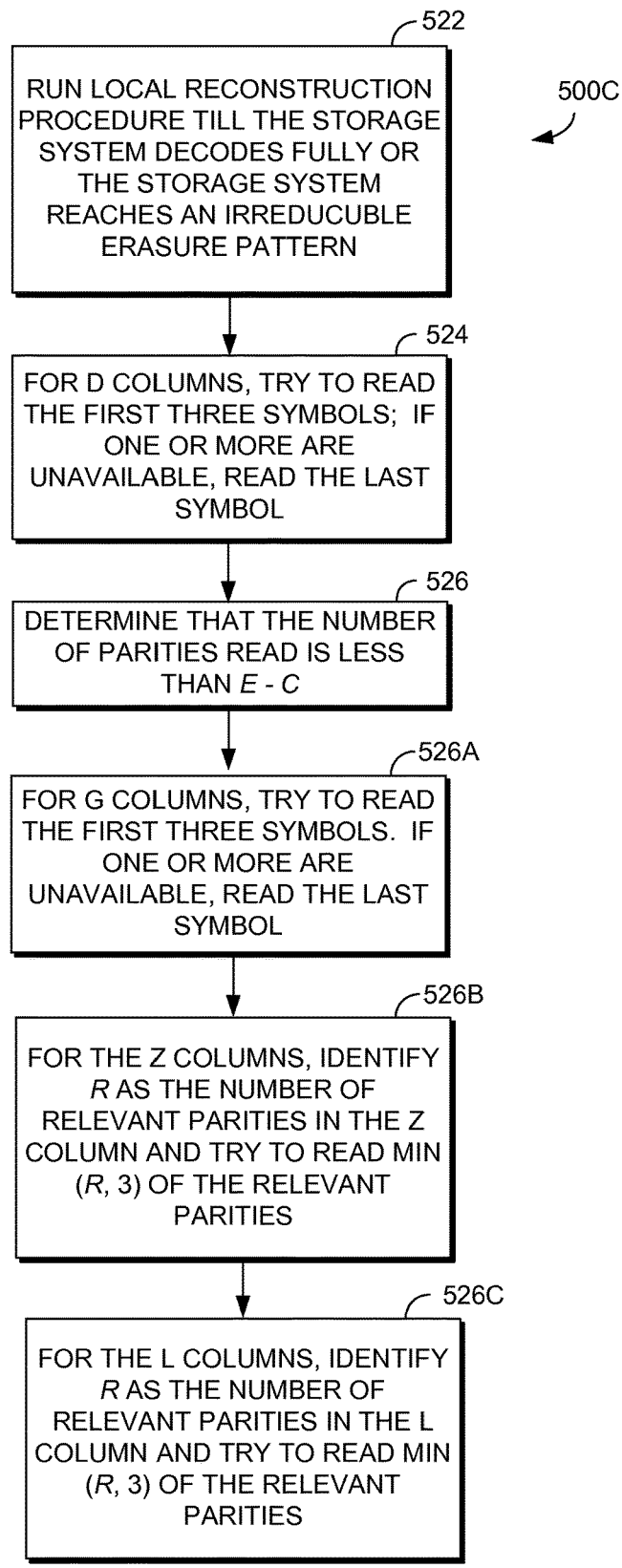

Accordingly, with reference to FIG. 5B, a second decoding strategy 500B includes Step 1 (block 512)—Run the local reconstruction procedure till the storage system decodes the erasure codes fully or the storage system reaches an irreducible erasure pattern. Step 2 (block 514)—For the D and G columns, try to read the first three symbols. If one or more are unavailable, read the last symbol. Step 3 (block 516)—For L and Z columns, Step 3a (block 516A)—Let r be the number of relevant parities in that column. Step 3b (516B)—the storage system will try to read min(r,3) of the relevant parities. Reading relevant parities in Step 3 can be justified by way of example. Consider an irrelevant parity in a local group, the argument for zone parities is identical. If it lies in the first three rows, then since it is irrelevant, all the data symbols it protects are available. The storage system will know all these Symbols by Step 2, so the storage system knows their XOR. Assume it lies in the last row, so it is the parity of the column parities. Since it is irrelevant, all the column parities are available. The storage system still may not read all of them in Step 2. But if the storage system omits the column parity, it means that the storage system has succeeded in reading all the data symbols in that column.

Hence the storage system knows the value of all the column parities for the data columns. So the storage system knows their XOR.

In the decoding strategy above, the storage system does not optimize the number of reads for how many missing symbols there are. However, such an optimization is described below. Consider all the data columns. Assume that there are e erased symbols that sit in c columns. This gives c independent equations in e variables, and the storage system needs e−c more independent parities. The storage system can read these in the order of global, (relevant) zone and (relevant) local group parities.

Accordingly, a third decoding strategy 500C includes Step 1 (block 522)—Run the local reconstruction procedure till the storage system decodes the erasure codes fully or reaches an irreducible erasure pattern. In the latter case, assume that the data columns have e erasures in c columns. Step 2 (block 524)—For the D columns, the strategy further includes reading the first three symbols. If one or more are unavailable, the decoding strategy further reads the last symbol.

Step 3 (block 526)—while the number of parities read is less than e−c:

(a) (block 526A)—For the G columns, the decoding strategy includes reading the first three symbols. If one or more are unavailable, the decoding strategy further includes reading the last symbol.

(b) (block 526B)—For the Z columns, Let r be the number of relevant parities in that column. The decoding strategy includes reading min(r, 3) of the relevant parities.

(c) (block 526C)—For the L columns—Let r be the number of relevant parities in that column. The decoding strategy includes reading min(r, 3) of the relevant parities. In the unlikely event that the storage system is unable to decode using only e−c symbols, the storage system can revert to decoding strategy 2.

Embodiments described herein further support local decoding. By way of example, consider the scenario where a storage system erasure coded data has a set of erasures, and then a request arrives for some erased data symbol. The goal of the storage system is to serve this request with the minimum number of reads. It is contemplated that the storage system is configured to try and serve the read request within one or two levels of iteration of local reconstruction procedures. In one-level decoding, the storage system can recover the requested symbol using columns, local group or zone decoding. In addition the storage system can also consider the following two-level procedures, which can be classified according to a decoder component in the storage system that is used for the requested symbol at the top level.

Accordingly, local decoding can be based on column groups, local groups, and zones groups, as described below. With reference to the column group, the local decoding steps include the following: consider the column containing the requested symbol. Try and recover all the other erasures in that column using the respective local groups. If all of these succeed, decode the column using its parity. With reference to the local group, the local decoding steps include the following: Consider the local group containing the requested symbol. Try and recover all the other erasures in that local group using the respective columns. If all of these succeed, decode the local group using its parity. With reference to the zone group, the local decoding steps include the following: Consider the zone containing the requested symbol. Try and recover all the other erasures in that zone using the respective columns. If sufficiently many succeed so that the remaining errors in the zone can be corrected by LRC, then decode using the zone. This gives a total of six options for decoding. The relative order in which to try these options will depend on inter-zone bandwidth. If the bandwidth is high, then column decoding is inexpensive, as it only requires three reads (but across zones). If the inter-zone bandwidth is low, local group and zone decoding which only require intra-zone communication might be faster, with local group preferred over zone.

For two-level decoding, all the schemes require inter-zone communication. Using column decoding at the top level means that all the communication at the bottom level is within zones. This might be the preferred option among the two-level options for the low bandwidth setting. Finally, in the setting where the inter-zone bandwidth is high, one might even prefer two level column or local-group decoding to one-level zone decoding.

Figure 6:
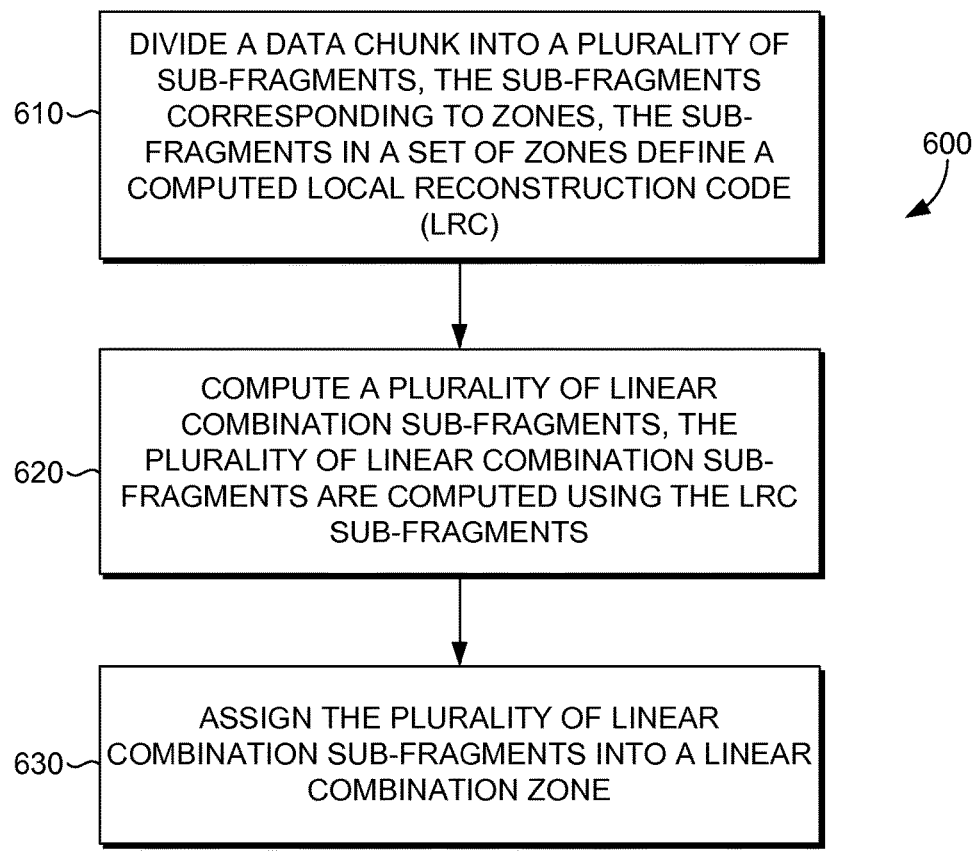
FIG. 6 is a flow diagram showing a method for erasure coding data across multiple zones, in accordance with embodiments of the present invention.

Turning now to FIG. 6, a flow diagram is provided that illustrates a method 600 for erasure encoding data with enhanced local protection groups. At block 610, a data chunk is divided into a plurality of fragments. The plurality of fragments correspond to zones, where the fragments in a set of zone define a computed Local Reconstruction Code (LRC). The LRC fragments include: at least one data fragment, at least one local parity, and at least one global parity. For example, FIG. 1B includes two local parities $L(X)$ and $L(Y)$ and two global parities $H_1(X,Y)$ and $H_2(X,Y)$.

At block 620, a plurality of linear combination fragments is computed. The plurality of linear combination fragments are computed using the LRC fragments. The linear combination fragments are computed based on a linear combination of fragments (e.g., a column group) in the LRC in a vertical direction to define the corresponding fragments in the linear combination zone. At block 630, the plurality of linear combination fragments is assigned to a linear combination zone. It is contemplated in a VLRC that the the assignment of fragments within a particular column group can be arbitrarily placed within the corresponding column group.

Figure 7:
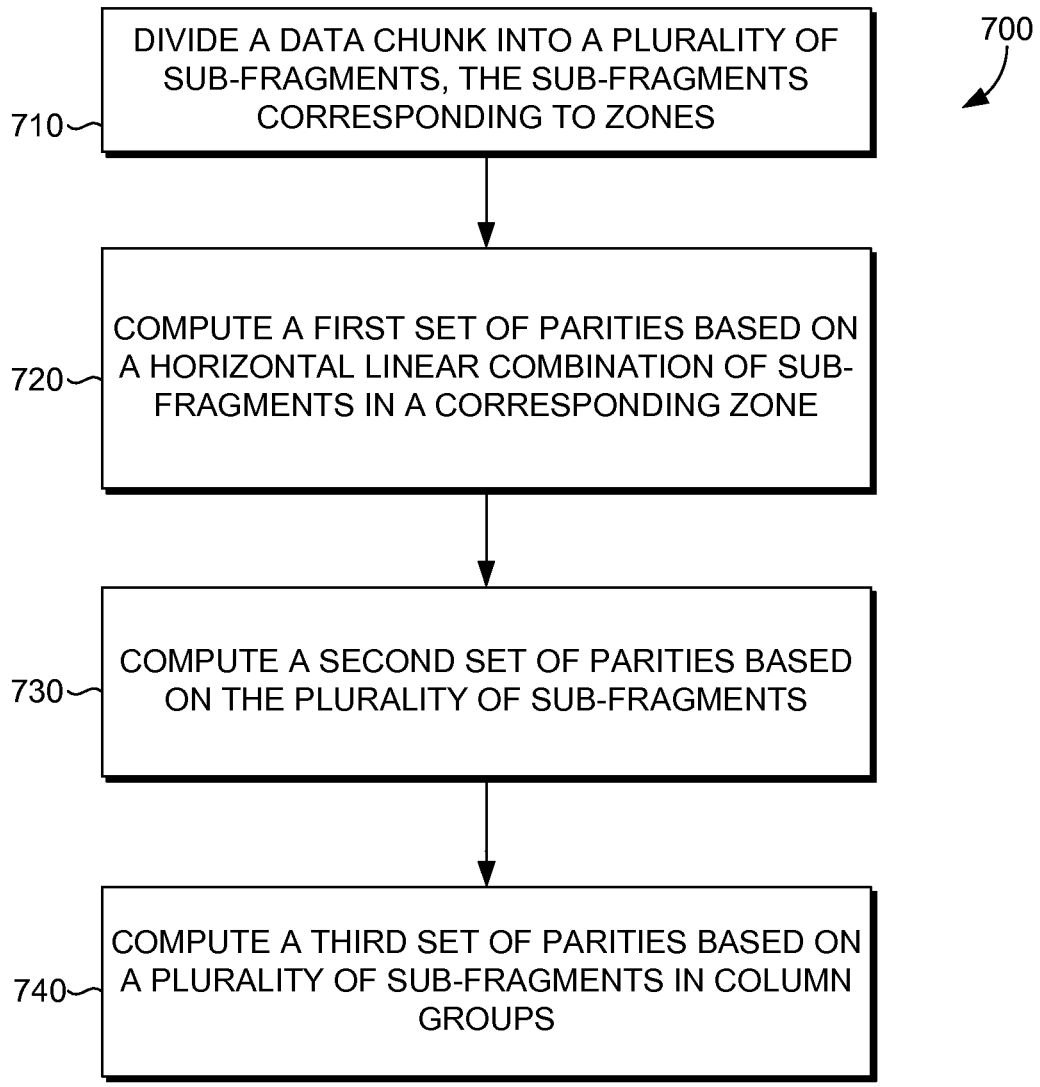
FIG. 7 is a flow diagram showing a method for erasure coding data across multiple zones, in accordance with embodiments of the present invention.

Turning now to FIG. 7, a flow diagram is provided that illustrates a method 700 for erasure encoding data with enhanced local protection groups. The method can specifically compute a Zone Local Reconstruction Code ("ZZG-2"). Initially at block 710, a data chunk is divided into a plurality of fragments. At block 720, a first set of parities is computed based on a horizontal linear combination of fragments in a corresponding zone. For example, in FIG. 2, $X_0$-$X_{13}$, $Y_0$-$Y_{13}$, and $W_0$-$W_{13}$ define corresponding parities $Z_1(X)$ and $Z_2(X)$, $Z_1(Y)$ and $Z_2(Y)$ and $Z_1(Y)$ and $Z_2(Y)$. The first set of parities $Z_1(X)$ and $Z_2(X)$, $Z_1(Y)$ and $Z_2(Y)$ and $Z_1(W)$ and $Z_2(W)$ define a column group. At block 730, a second set of parties is computed based on the plurality of fragments. For example, $G_1(X, Y, W)$, $G_2(X, Y, W)$, and $G_3(X, Y, W)$. The second set of parities defines a column of global parities. At block 740, a third set of parities is computed based on a plurality of fragments in column groups. The third set of parities defines a linear combination zone of parities based on linear combination of column groups in pairs. It is contemplated that the fragments in corresponding zones define a Maximum Distance Separable (MDS) code, and pairs of column groups each form MDS codes.

Figure 8:
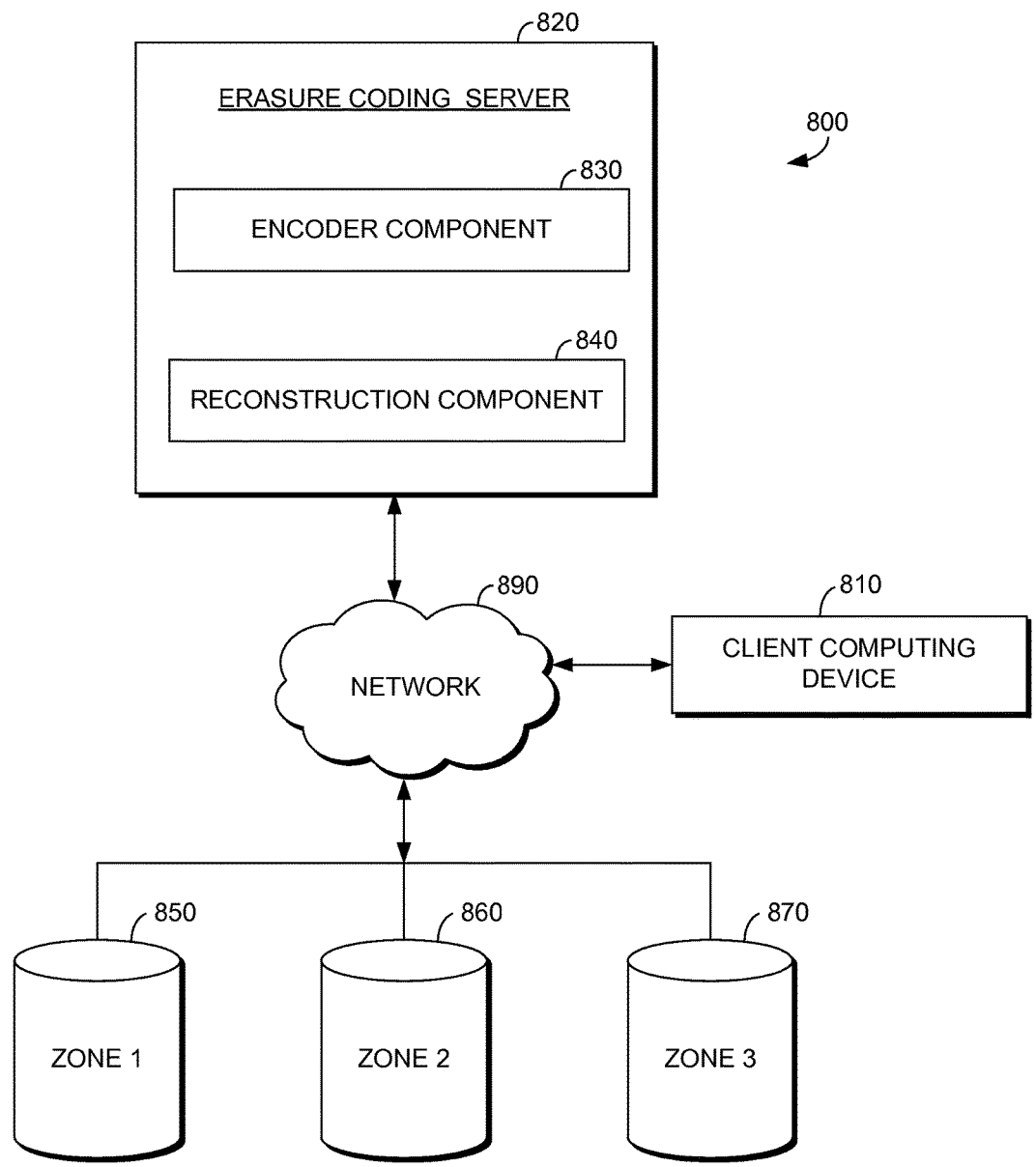
FIG. 8 is a block diagram of a distributed storage system suitable for use in implementing embodiments of the present invention.

Turning to FIG. 8 the client computing device 810 may include any type of computing device, such as the computing device 100 described with reference to FIG. 1, for example. A plurality of client computing devices 810 may be associated with the distributed storage system 800. The client computing device 810 may be used to retrieve data stored any of the one or more zones described herein.

Zones may refer to particular buildings, data centers, and geographic regions providing a storage service. For example, a data center may be implemented as a cloud computing environment that is configured to allocate virtual machines within the data center for use by a service application. Erasure coding across multiple zones encompasses providing erasure coding at any level of fault tolerance defined by the storage service in the zone. It will be understood and appreciated by those of ordinary skill in the art that the information stored in association with the zone may be configurable and may include any information relevant to, among other things, erasure coding data including data chunks, local parities, and zone parities. The content and volume of such information are not intended to limit the scope of embodiments of the present invention in any way.

Further, though illustrated as a single, independent component, the zones may, in fact, be a plurality of components including storage devices, for instance a collection of racks and servers and, another external computing device (not shown), and/or any combination thereof. As such, providing zone fault-tolerance allows zones to have the capacity to continue to operate in the event of the accidental or deliberate loss of service in components of the zone that impact access or cause data loss. Accidental loss of service may include failures in storage, transmission or process components e.g., power failure, hardware failure, internet service provider (ISP) failure or data corruption. Regional zone failures may be associated with natural disasters, earthquakes, flood, tornadoes, etc. that cause data loss. Deliberate loss of service may include planned network outages (e.g., maintenance outages) during which the data in a zone is unavailable.

As zones are large-scale storage systems, the correlated failure due to large-scale outages is supported by embodiments in the present embodiments. The implementation erasure coding across zones, however, creates a different set of implementation constraints. For example, with continued reference to FIG. 8, the network 890 may include, without limitation, one or more local area networks (LANs) and/or wide area networks (WANs). Such networking environments are commonplace in offices, enterprise-wide computer networks, intranets and the Internet. With embodiments of the present invention, the cost dimension for the erasure scheme is associated with the distributed storage system zones (e.g., zone-1 850, zone-2 860 and zone-3 870). The distributed storage system 800 may include several sub-storage systems each within a single zone. Each of the sub-systems may be linked together by the network 890 backbone spanning across the zones. As such, total cost may be determined based on a single-zone sub-storage system and cross-zone network backbone. The single-zone sub-storage system may be a function of the storage overhead—the total amount of physical storage space required to store a specified amount of user data. The cross-zone network backbone may be a function of the amount of network bandwidth to be provisioned to support the storage system.

The performance metric may refer to the ability to recover from different types of failure scenarios. Different types of zone failures have different impacts on system performance. As such, when a storage node or a fault domain within a zone fails, the system runs in a degraded mode. However, when an entire zone fails, the system runs in a disaster mode. In order to characterize performance, for example, in a degraded mode, a degraded read cost (i.e., the number of disk I/Os required to read one unit of user data from failed storage node) may be defined. Similarly a disaster read cost may be defined as the number of disk I/Os required to read one unit of user data that was in a failed zone. Disk I/Os are contemplated to include network transfer costs for communicating data. The reliability metric may also be a function of the network 890 in that the reliability is based upon the ability to reconstruct data after one or more machines fails or becomes unavailable. For example, reliability may be evaluated based on a Mean Time to Data Loss (MTTDL).

The erasure coding server 820 of FIG. 8 is generally configured to receive and communicate information for erasure coding. Information may generally include, communications (e.g., requests for encoding or reconstructing data) and/or actual data chunks that are encoded with erasure coding scheme described herein. As illustrated, the erasure coding server 820 includes an encoder component 830 and a reconstruction component 840. The erasure coding server 820 has access to the different zones. For example, the erasure coding server 820 may receive and send data (e.g., data chunks) to the different zones. Data chunks may be data that need to be encoded or may be data that have been recovered. It is contemplated that the data may also be received from an external storage component (not shown) that is not in one of the zones shown.

An embodiment of the present invention may include a plurality of erasure coding servers 820 each associated with several zones, where data at the zones is processed according to embodiments of the present invention. Further, the erasure coding server 820 may be associated with an interface with interface elements that facilitate functions executed by the erasure coding server. For example, interface element may provide for selection of particular erasure coding scheme for particular chunks of data. Interface elements may provide information on particular dimensions and implementation constraints associated with the erasure coding schemes such that a scheme may be selected based on particular considerations associated with an entity (e.g., tenant having a service application) storing the data. Any and all such variations, and any combination of interface elements to realize embodiments of the present invention are contemplated to be within the scope.

The encoder component 830 of the erasure coding server 830 is configured to receive requests to encode data. A data chunk may be received along with a selected erasure coding scheme for encoding the data chunk. The encoder component may also determine and/or select the type of erasure coding that is implemented for the data chunk. Determining an erasure coding scheme is based at least in part on dimensions (e.g., cost, performance, and reliability) associated with the encoding scheme. Selecting an erasure encoding scheme may be facilitated by interface elements of the erasure coding server.

In particular, the goals of an entity (e.g., a tenant associated with a cloud computing platform) storing a data chunk may be aligned with a coding scheme that achieves the goals. For example, an entity may value a first encoding scheme over a second encoding scheme in that the scheme affords better performance. Further, the encoder component 830 is configured to execute encoding steps associated with the different coding schemes. As discussed in more detail below, the steps for encoding data chunks are performed by the encoder component 830. For example, the encoder components divide data into chunks, computes different parities, identifies the location for the data chunks and parities, and communicates the data chunks as directed by each erasure coding scheme.

The reconstruction component 850 of the erasure coding server 830 is configured to receive requests to reconstruct or recover data. As discussed, data loss may be either accidental or deliberate data loss. A portion of an encoded data chunk to be recovered may be identified by the reconstruction component 850 along with an associated erasure coding scheme for recovering the portion of the encoded data chunk. It is contemplated that information of data loss and/or details of data to be recovered may be communicated from an external source (not shown) to the reconstruction component that then recovers the portion of the encoded data. Similar to the encoding data chunks, the reconstruction process may also be facilitated by interface elements of the erasure coding server 820. The encoder component 830 is configured to recover portions of the encoded data chunk according to the coding schemes. In particular, an erasure coding scheme and local or zone parities associated with the portion of the data chunk to be recovered. As discussed in more detail below, the steps and components for reconstruction portions of the data chunk vary based on the erasure coding scheme.

Figure 9:
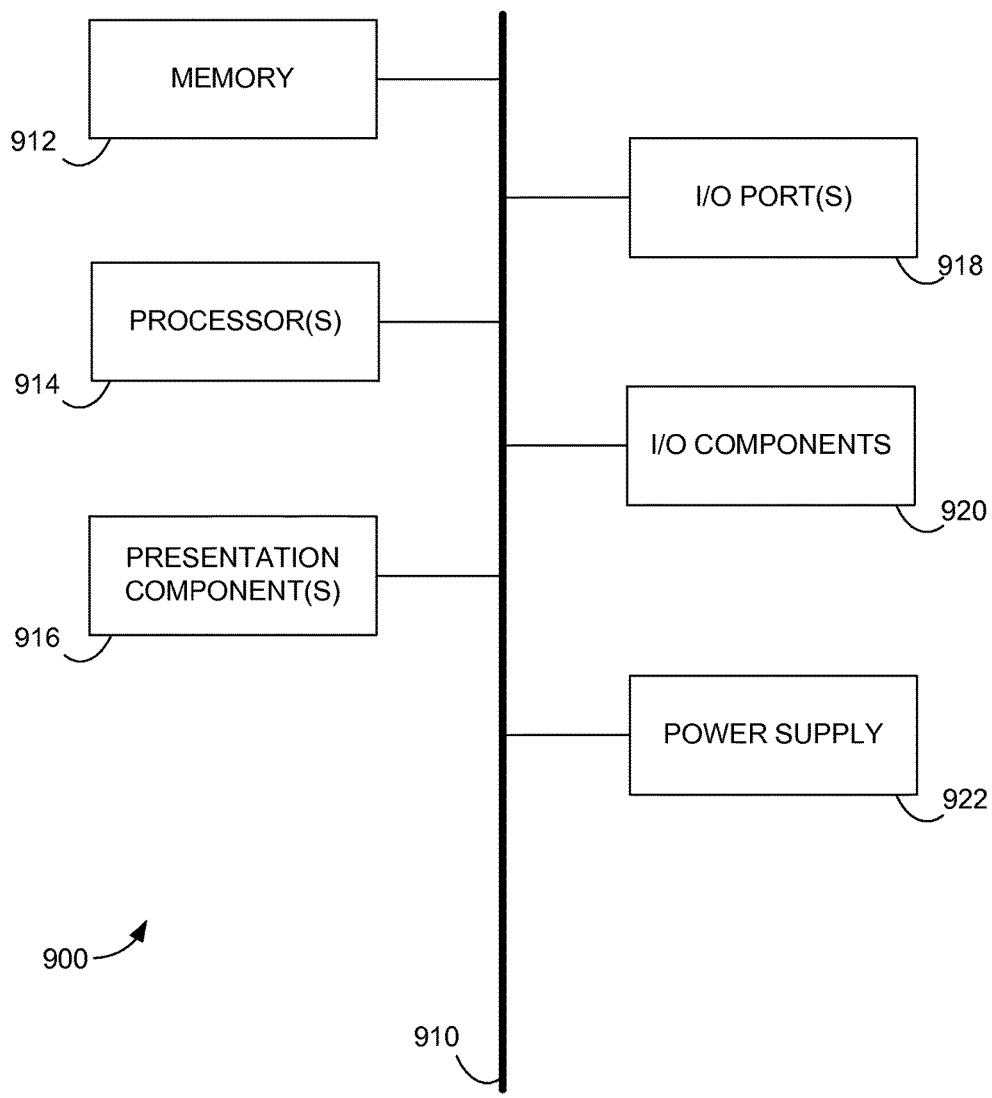
FIG. 9 is a block diagram of an exemplary computing environment suitable for use in implementing embodiments of the present invention.

Having described embodiments of the present invention, an exemplary operating environment in which embodiments of the present invention may be implemented is described below in order to provide a general context for various aspects of the present invention. Referring initially to FIG. 9 in particular, an exemplary operating environment for implementing embodiments of the present invention is shown and designated generally as computing device 900. Computing device 900 is but one example of a suitable computing environment and is not intended to suggest any limitation as to the scope of use or functionality of the invention. Neither should the computing device 900 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc. refer to code that perform particular tasks or implement particular abstract data types. The invention may be practiced in a variety of system configurations, including hand-held devices, consumer electronics, general-purpose computers, more specialty computing devices, etc. The invention may also be practiced in distributed computing environments where tasks are performed by remote-processing devices that are linked through a communications network.

With reference to FIG. 9, computing device 900 includes a bus 910 that directly or indirectly couples the following devices: memory 912, one or more processors 914, one or more presentation components 916, input/output ports 918, input/output components 920, and an illustrative power supply 922. Bus 910 represents what may be one or more busses (such as an address bus, data bus, or combination thereof). Although the various blocks of FIG. 9 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. We recognize that such is the nature of the art, and reiterate that the diagram of FIG. 9 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 9 and reference to "computing device."

Computing device 900 typically includes a variety of computer-readable media. Computer-readable media can be any available media that can be accessed by computing device 900 and includes both volatile and nonvolatile media, removable and non-removable media. By way of example, and not limitation, computer-readable media may comprise computer storage media and communication media.

Computer storage media include volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 100. Computer storage media excludes signals per se.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 912 includes computer storage media in the form of volatile and/or nonvolatile memory. The memory may be removable, non-removable, or a combination thereof. Exemplary hardware devices include solid-state memory, hard drives, optical-disc drives, etc. Computing device 900 includes one or more processors that read data from various entities such as memory 912 or I/O components 920. Presentation component(s) 916 present data indications to a user or other device. Exemplary presentation components include a display device, speaker, printing component, vibrating component, etc.

I/O ports 918 allow computing device 900 to be logically coupled to other devices including I/O components 920, some of which may be built in. Illustrative components include a microphone, joystick, game pad, satellite dish, scanner, printer, wireless device, etc.

Accordingly, in a first embodiment described herein, a computer-implemented method for erasure coding with enhanced local protection groups is provided. The method includes dividing a data chunk into a plurality of fragments, the fragments corresponding to zones, where the fragments in a set of zones define a computed Local Reconstruction Code (LRC). The method also includes computing a plurality of linear combination fragments, the plurality of linear combination fragments are computed using the LRC fragments. The method further includes assigning the plurality of linear combination fragments into a linear combination zone.

In a second embodiment described herein, a system for performing operations on erasure coded data having enhanced local group is provided. The system includes an encoding component configured for: computing a Vertical Local Reconstruction Code based on: dividing a first data chunk into a plurality of fragments, the fragments corresponding to zones, the fragments in a set of zones define a computed Local Reconstruction Code (LRC); computing a plurality of linear combination fragments, the plurality of linear combination fragments are computed using the LRC fragments; and assigning the plurality of linear combination fragments into a linear combination zone.

The system also includes a decoding component configured for: decoding a local group having data fragments and parity fragments that define a local group parity check code, the local group parity check code corrects a single erasure per local group; decoding a column group having fragments that define a column group parity check code, the column group parity check code corrects a single erasure per column; and decoding a zone group having two local groups and two zone parities that define a zone parity check code, the zone parity check code corrects erasure patterns having at least one local group and two more fragments in the zone group.

In a third embodiment described herein, a computer-implemented method for local reconstruction of enhanced local groups is provided. The method includes decoding column groups of an erasure coded data chunk, where column decoding is based on a column group parity check code. The method includes determining that at least one local group comprises a single erasure. The method also includes decoding the at least one local group of the erasure code data chunk, where local group decoding comprises a local group parity check code that corrects a single erasure per local group. The method further includes determining that at least one zone group comprises a Local Reconstruction Code (LRC), where the LRC corrects the zone group. The method includes decoding the zone group of the erasure code data chunk, wherein zone group decoding comprises a zone LRC that corrects an erasure pattern of 1 per local group and 2 more error locations.

For purposes of this disclosure, the word "including" has the same broad meaning as the word "comprising," and the word "accessing" comprises "receiving," "referencing," or "retrieving." In addition, words such as "a" and "an," unless otherwise indicated to the contrary, include the plural as well as the singular. Thus, for example, the constraint of "a feature" is satisfied where one or more features are present. Also, the term "or" includes the conjunctive, the disjunctive, and both (a or b thus includes either a or b, as well as a and b).

For purposes of a detailed discussion above, embodiments of the present invention are described with reference to erasure coding data across multiple zones based on erasure coding schemes that are schematically depicted for exemplary zones; however the zones depicted herein are merely exemplary and it is contemplated that a plurality of zones may be utilized with erasure coding schemes described herein. Components can be configured for performing novel aspects of embodiments, where configured for comprises programmed to perform particular tasks or implement particular abstract data types using code. Further, while embodiments of the present invention may generally refer to the distributed storage system and the schematics described herein, it is understood that the techniques described may be extended to other implementation contexts.

Embodiments of the present invention have been described in relation to particular embodiments which are intended in all respects to be illustrative rather than restrictive. Alternative embodiments will become apparent to those of ordinary skill in the art to which the present invention pertains without departing from its scope.

From the foregoing, it will be seen that this invention in one well adapted to attain all the ends and objects hereinabove set forth together with other advantages which are obvious and which are inherent to the structure.

It will be understood that certain features and sub-combinations are of utility and may be employed without reference to other features or sub-combinations. This is contemplated by and is within the scope of the claims.

The invention claimed is:

1. A computer-implemented method for erasure coding with enhanced local protection groups, the method comprising:
dividing, using one or more hardware processors, a data chunk into a plurality of fragments, the fragments corresponding to zones, wherein the fragments in a set of zones define a computed Local Reconstruction Code (LRC);
computing, using the one or more hardware processors, a plurality of linear combination fragments, the plurality of linear combination fragments are computed using a linear combination of fragments in the LRC in a vertical direction to define corresponding linear combination fragments; and
assigning, using the one or more hardware processors, the plurality of linear combination fragments into a linear combination zone, wherein a first subset of the plurality of linear combination fragments define a recovery LRC across zones for recovering one or more of the plurality of fragments.

2. The method of claim 1, wherein fragments in the LRC comprise at least one data fragment, at least one local parity, and at least one global parity.

3. The method of claim 1, wherein the plurality of linear combination fragments are computed to define a corresponding fragment in the linear combination zone.

4. The method of claim 3, wherein a set of fragments in the LRC and a linear combination fragment computed based on the set of fragments in the LRC define a column group.

5. The method of claim 4, further comprising assigning fragments within the column group to arbitrary locations within the zones associated with the column group.

6. A system for performing operations on erasure coded data having enhanced local group, the system comprising:
an encoding component configured for:
computing an inter-zone adaptive erasure coding (uber code) based on:
dividing a data chunk into a plurality of fragments, the fragments corresponding to zones;
computing a plurality of parities for a selected zone based on the fragments, the plurality of parities comprising at least one zone parity and at least one global parity;
computing a plurality of exclusive-or zone fragments, the exclusive-or zone fragments are computed based on an exclusive-or in a vertical direction of fragments in a column group to define a corresponding fragment in an exclusive-or zone; and
assigning the plurality of exclusive-or fragments to the exclusive-or zone; and
a decoding component configured for:
decoding a local group having data fragments and parity fragments that define a local group parity check code, the local group parity check code corrects a single erasure per local group;
decoding a column group having fragments that define a column group parity check code, the column group parity check code corrects a single erasure per column; and
decoding a zone group having two local groups and two zone parities that define a zone parity check code, the zone parity check code corrects erasure patterns having at least one local group and two more fragments in the zone group.

7. The system of claim 6, wherein the fragments in a set of zones define a computed Local Reconstruction Code (LRC), wherein fragments in the LRC comprise at least one data fragment, at least one local parity, and at least one global parity; and wherein linear combination fragments are computed based on linear combination of fragments in the LRC in the vertical direction to define a corresponding fragment in a linear combination zone, and wherein a set of fragments in the LRC and linear combination fragment computed based on the set of fragments in the LRC define a corresponding column group for the set of fragments.

8. The system of claim 6, wherein the encoding component is further configured for:
computing a Zone Local Reconstruction Code (ZZG-2) based on:
dividing a data chunk into a plurality of fragments, the fragments corresponding to zones;
computing a first set of parities based on a horizontal linear combination of fragments in a corresponding zone;
computing a second set of parities based on the plurality of fragments; and
computing a third set of parities based on a plurality of fragments in column groups.

9. The system of claim 8, wherein the first set of parities defines a column group of zone parities, the second set defines a single column of global parities, and wherein the third set of parities define a linear combination zone of parities based on linear combination of column groups in pairs.

10. The system of claim 9, wherein the fragments in corresponding zones define a Maximum Distance Separable (MDS) code, and pairs of column groups each form MDS codes.

11. The system of claim 6, wherein the encoding component is further configured for:
computing a Vertical Local Reconstruction Code (VLRC) based on:
dividing a data chunk into a plurality of fragments, the fragments corresponding to zones, wherein the fragments in a set of zones define a computed Local Reconstruction Code (LRC);
computing a plurality of linear combination fragments, the plurality of linear combination fragments are computed using the LRC fragments; and
assigning the plurality of linear combination fragments into a linear combination zone.

12. The system of claim 11, wherein the decoding component is configured to determine that the VLRC code is correctable based on:
for each column group in the VLRC code, wherein a set of fragments in the LRC and a linear combination fragment computed based on the set of fragments in the LRC define a corresponding column group;
determining that the linear combination fragment is available; and substituting the linear combination fragment for a failed fragment in a selected column group based on a replacement ordering preference for a lowest row from the top; and determining that the VLRC code is correctable when the LRC after substituting the linear combination fragments is correctable.

13. The system of claim 6, wherein the decoding component is configured to perform local reconstruction procedures based on one or more of the following:
   local group decoding, wherein local group decoding comprises a local group parity check code that corrects a single erasure per local group;
   column group decoding, wherein column group decoding comprises a column group parity check code that corrects a single erasure per column; and
   zone decoding, wherein zone decoding comprises a zone Local Reconstruction Code (LRC) that corrects an erasure pattern of 1 per local group and 2 more error locations.

14. The system of claim 11, wherein the decoding component is configured to perform local reconstruction based on:
   determining that an erasure exists in erasure coded data;
   upon determining that the erasure exist in the erasure coded data, executing column group decoding;
   determining that an erasure exists in a local group;
   upon determining that the erasure exists in the local group, executing local group decoding;
   determining that an erasure exists in a zone group; and
   upon determining that the erasure exists in the zone group, executing zone group decoding.

15. The system of claim 6, wherein the decoding component is configured for decoding erasures based on one of the following decoding strategies:
   a first decoding strategy comprises:
   executing a local reconstruction procedure to decode an erasure or identify an irreducible erasure pattern; and
   for a selected column, reading a last symbol from the selected column when one or more symbols from a set of first three symbols of the selected column are unavailable;
   a second decoding strategy comprising:
   executing the local reconstruction procedure to decode an erasure or identify an irreducible erasure pattern; and
   for a selected data column or a selected global parity column, reading a last symbol from the selected data column or selected global parity column when one or more symbols from a set of first three symbols of the selected column or the selected global parity column are unavailable; and
   for a selected local parity column or a selected zone parity columns, reading min (r, 3), where r is a number of relevant parities in the selected local parity column or the selected zone parity column; and
   a third decoding strategy comprising:
   executing a local reconstruction procedure to decode an erasure or identify an irreducible erasure pattern; and
   for a selected data column, reading the last symbol from the selected data column when one or more symbols from a set of first three symbols of the selected data column are unavailable; and
   upon making a determination that a number of parities read in less than e-c, wherein e is a number of erasures in c columns, executing the following:
   for a selected global parity column, reading the last symbol from the selected global column when one or more symbols from a set of first three symbols of the selected global column are unavailable;
   for a selected zone parity column, reading min (r, 3), where r is a number of relevant parities in the selected zone parity column; and
   for a selected local parity column, reading min (r, 3), where r is a number of relevant parities in the selected local parity column.

16. A computer-implemented method for local reconstruction of enhanced local groups, the method comprising:
   decoding, using one or more hardware processors, column groups of an erasure coded data chunk, wherein column decoding is based on a column group parity check code, wherein the column group parity check code operates to determine whether a linear combination fragment for vertical parity is available in the column group to correct a single erasure per column, the linear combination fragment computed based on a linear combination in a vertical direction of a set of fragments in a Local Reconstruction Code (LRC) to define corresponding linear combination fragments;
   determining, using one or more hardware processors, that at least one local group comprises a single erasure;
   decoding, using the one or more hardware processors, the at least one local group of the erasure code data chunk, wherein local group decoding comprises a local group parity check code that corrects a single erasure per local group;
   determining, using the one or more hardware processors, that at least one zone group comprises the LRC, wherein the LRC corrects the zone group; and
   decoding, using the one or more hardware processors, the zone group of the erasure code data chunk, wherein zone group decoding comprises a zone LRC that corrects an erasure pattern of 1 per local group and 2 more error locations.

17. The method of claim 16, further comprising detecting an irreducible pattern in the erasure code data chunk, wherein the irreducible pattern comprises a pattern that is not decodable based on a local procedure.

18. The method of claim 17, wherein detecting the irreducible patterns is based on:
   determining, for columns m the erasure coded data, whether first three symbols are unavailable; and
   when one or more of the first three symbols is unreadable, reading a last symbol.

19. The method of claim 17, wherein detecting the irreducible pattern is based on:
   determining, for data columns and global parity columns of the erasure coded data, whether first three symbols are unavailable;
   when one or more of the first three symbols are unavailable, reading a last symbol;
   determining, for local columns and zone parity columns of the erasure code data, a number of relevant parities in the column; and
   reading at least a subset of the relevant parities.

20. The method of claim 16, wherein detecting the irreducible pattern is based on:
   determining, for data columns of the erasure coded data, whether first three symbols are unavailable;
   when one or more of the first three symbols are unavailable, reading a last symbol;
   determining, for global parity columns of the erasure coded data, whether first three symbols are unavailable;
   when one or more of the first three symbols are unavailable, reading a last symbol;

determining, for zone parity columns of the erasure code
   data, a number of relevant parities in the column;
reading at least a subset of the relevant parities;
determining, for local parity columns of the erasure code
   data, a number of relevant parities in the column; and
reading at least a subset of the relevant parities.

* * * * *